United States Patent [19]
Adriaenssens et al.

[11] Patent Number: 5,997,358
[45] Date of Patent: Dec. 7, 1999

[54] ELECTRICAL CONNECTOR HAVING TIME-DELAYED SIGNAL COMPENSATION

[75] Inventors: Luc Walter Adriaenssens, Red Bank; Amid Ihsan Hashim, Randolph, both of N.J.; Wayne David Larsen, Indianapolis, Ind.; Bryan Scott Moffitt, Red Bank, N.J.; Julian Robert Pharney, Indianapolis, Ind.

[73] Assignee: Lucent Technologies Inc., Murray Hill, N.J.

[21] Appl. No.: 08/923,741

[22] Filed: Sep. 2, 1997

[51] Int. Cl.⁶ .................................................... H01R 23/02
[52] U.S. Cl. ............................................ 439/676; 439/395
[58] Field of Search .................................... 439/676, 941, 439/620, 76.1, 395, 389, 390, 391

[56] References Cited

U.S. PATENT DOCUMENTS

| | | | |
|---|---|---|---|
| 4,418,239 | 11/1983 | Larson et al. | 174/34 |
| 5,096,442 | 3/1992 | Arnett et al. | 439/676 |
| 5,186,647 | 2/1993 | Denkmann et al. | 439/395 |
| 5,299,956 | 4/1994 | Brownell et al. | 439/638 |
| 5,310,363 | 5/1994 | Brownell et al. | 439/676 |
| 5,326,284 | 7/1994 | Bohbot et al. | 439/676 |
| 5,362,257 | 11/1994 | Neal et al. | 439/676 |
| 5,432,484 | 7/1995 | Klas et al. | 333/1 |
| 5,580,270 | 12/1996 | Pantland et al. | 439/395 |

FOREIGN PATENT DOCUMENTS

| | | |
|---|---|---|
| 2268484 | 11/1990 | Japan . |
| 2233157 | 1/1991 | United Kingdom . |

OTHER PUBLICATIONS

Mroczkowski, Electronic Connector Handbook, McGraw-Hill, p. 10.14, 1998.

Choudhury, et al., U.S. Patent Application Serial No. 08/668553, Filed Jun. 21, 1996.

Conorich, et al., U.S. Patent Application Serial No. 08/673711, Filed Jun. 21, 1996.

*Primary Examiner*—Paula Bradley
*Assistant Examiner*—Alexander Gilman
*Attorney, Agent, or Firm*—Michael A. Morra

[57] ABSTRACT

An electrical connector 60 achieves improved transmission performance by introducing predetermined amounts of compensation between two pairs of conductors that extend from its input terminals to its output terminals along interconnection paths. Electrical signals on one pair of conductors are coupled onto the other pair of conductors in two or more compensation stages that are time delayed with respect to each other. Illustratively, the electrical connector is a modular jack that is adapted to receive a modular plug 20. Associated with the modular plug and the input of the modular jack there exists a known amount of offending crosstalk $A_0$, which is approximately canceled by the two or more stages of compensating crosstalk. In a first stage, compensating crosstalk $A_1$ is introduced between the pairs, and it has a first predetermined magnitude and phase at a given frequency. In a second stage, compensating crosstalk $A_2$ is introduced between the pairs, and it has a second predetermined magnitude and phase at the given frequency. Multiple compensation stages are needed because, at high frequencies, compensating crosstalk cannot be introduced that is exactly 180 degrees out of phase with the offending crosstalk because of propagation delay. The electrical connector 60 is constructed using a multi-layer printed wiring board 600 having input and output terminals where connection to metallic wires is made. These terminals are interconnected on the printed wiring board by metallic paths that are arranged to provide multiple stages of compensating crosstalk. When the connector 60 is joined to a plug 20, the near-end crosstalk of the combined structure is extremely low at frequencies up to at least 200 MHz.

27 Claims, 9 Drawing Sheets

ELECTRICAL CONNECTOR HAVING TIME-DELAYED SIGNAL COMPENSATION

TECHNICAL FIELD

This invention relates to an apparatus and method for reducing interference between conductors in an electrical connector by the introduction of compensating signals.

BACKGROUND OF THE INVENTION

There appears to be a healthy competition developing between optical and electrical communication systems. If electrical systems are to remain viable for distributing signals at high transmission speeds, then electrical cables and connectors must improve their transmission performance or face replacement by optical systems. However, since nearly all consumer and business communication systems are equipped to handle electrical signals exclusively, electrical systems presently enjoy a competitive advantage. Nevertheless, the replacement of electrical equipment with optical equipment may ultimately occur anyway, but it can be forestalled for the foreseeable future by substantial improvements in high-frequency performance.

In an electrical communication system, it is sometimes advantageous to transmit information (video, audio, data) in the form of balanced signals over a pair of wires (hereinafter "wire-pair") rather than a single wire, wherein the transmitted signal comprises the voltage difference between the wires without regard to the absolute voltages present. Each wire in a wire-pair is capable of picking up electrical noise from sources such as lightning, automobile spark plugs and radio stations to name but a few. Balance is a measure of impedance symmetry in a wire pair as between its individual conductors and ground. When the impedance to ground for one conductor is different than the impedance to ground for the other conductor, then common mode (longitudinal) signals are undesirably converted to differential mode (transverse) signals. Additionally, return loss comprises a reflection of the incoming signal that effectively occurs when the terminating impedance does not match the source impedance. Of greater concern, however, is the electrical noise that is picked up from nearby wires that may extend in the same general direction for long distances. This is referred to as crosstalk, and so long as the same noise signal is added to each wire in the wire-pair, then the voltage difference between the wires will remain about the same. In all of the above situations, undesirable signals are present on the electrical conductors that can interfere with the information signal.

An example of an electrical communication system where crosstalk is likely to occur is shown in FIG. 1, which discloses a high-speed communication terminal 1 and cables 2, 3—each containing several wire-pairs. Electrical interconnection between cables may be facilitated by the use of standard telecommunications connectors that are frequently referred to as modular plugs and jacks, or other style plugs and receptacles. Connecting apparatus includes a modular plug 20, and a modular jack 30 that comprises a jack frame 310 and a connector assembly 320. Modular plug 20 inserts into opening 315 on the front side of jack frame 310 and communicates electrical signals to and from terminal 1. Inserted into the back side of jack frame 310 is a connector assembly 320, which receives and holds wires from cable 3 that are individually pressed into slots 321 where mechanical and electrical connection is made. And while there are many places in FIG. 1 where undesirable signals attributable to crosstalk, imbalance and return loss are present, it is particularly desirable to reduce the undesirable signals that arise within connecting apparatus 20, 30.

Connecting apparatus 20, 30 may include up to eight or more wires that are close together—a condition that leads to excessive crosstalk over relatively short distances. If the electrical conductors that interconnect with these terminals are close together for any distance, as is the case in present designs, then crosstalk between these wire-paths is particularly troublesome. In particular, near-end crosstalk (NEXT), which is the crosstalk energy traveling in the opposite direction to that of the signal in the disturbing wire-pair, is about 25 dB below the level of the incoming signal at 100 MHz in modular jack designs such as shown in U.S. Pat. No. 5,096,442 that issued on Mar. 17, 1992. One such modular jack is known as the M1 Communication Outlet, which is manufactured by Lucent Technologies. FIG. 2 illustrates the polarity and magnitude of the NEXT between two pairs of conductors within the plug 20 and jack 30 by positive (+) signs. Note that the overall NEXT in the connecting apparatus comes from both the plug 20 and jack 30. Because the conductor paths within the plug and jack are close together and extend in a straight line, NEXT is substantial.

U.S. Pat. No. 5,186,647 (the '647 patent) issued on Feb. 16, 1993 and made a substantial improvement to the design of modular jacks by crossing the path of one of the conductors within the connector, over the path of another of the conductors within the connector. This was the first time that compensating crosstalk was added to the undesirable crosstalk within an electrical connector in an attempt to cancel it. FIG. 3 illustrates the polarity and magnitude of the NEXT between two pairs of conductors within the plug 20 and jack 30 by positive (+) and negative (−) signs. This simple technique improves NEXT at 100 MHz, by a startling 17 dB, thereby enabling the electrical connector to comply with the Category 5 requirements specified in ANSI/EIA/TIA—568A. An example of such a modular jack is the M100 Communication Outlet, which is manufactured by Lucent Technologies. In FIG. 3, offending crosstalk is shown in Section 0 coming from the plug 20 and a first portion of jack 30; while compensating crosstalk is shown in Section I coming from a second portion of jack 30.

Techniques have been developed for further reducing crosstalk in the present generation of electrical connectors, where levels that are about 46 dB below the level of the incoming signal at 100 MHz have been achieved. An example of such a connector is the MPS100 Communication Outlet, which is also manufactured by Lucent Technologies. Nevertheless, what is desired, but is not disclosed in the prior art, is a technique for improving the balance and return loss characteristics of an electrical connector and, more particularly, a technique for reducing crosstalk in the electrical connector to levels that are more than 46 dB below the level of the incoming signal at 100 MHz

SUMMARY OF THE INVENTION

An electrical connector includes at least two conductors that extend along an interconnection path between input and output terminals of the connector. Undesirable signal coupling between the conductors is significantly reduced by recognizing that the undesired signal, $A_0$, is a vector quantity whose magnitude and phase both need to be considered. Compensating signals $A_1, A_2, \ldots A_n$ are coupled between the conductors at two or more locations along the interconnection path in order to approximately cancel the undesired signal. At a given frequency, $f_0$, the magnitude and phase of the compensating signals at the two or more locations are selected to substantially cancel the magnitude and phase of the undesired signal. The locations where compensating signals are introduced are time delayed with respect to each other in order to control the phase of the compensating signals so that the vector sum $A_0+A_1+\ldots+A_n$ approximately equals zero.

In illustrative embodiments of the invention, the undesired signal comprises NEXT between pairs of conductors. The locations where compensating signals are introduced are separated in distance along the interconnection path to create the time delay. Additionally, a printed wiring board having multiple layers is used in the construction of the connector. Such construction allows many stages of compensating signals to be introduced in a compact space.

In one illustrative embodiment of the invention, a metallic lead frame having multiple crossover stages is used in the construction of the connector.

In another illustrative embodiment of the invention, a printed wiring board having discrete components is used in the construction of the connector.

Advantageously, use of time-delayed signal compensation according to the invention is useful for improving the return loss, balance and crosstalk characteristics of an electrical connector.

BRIEF DESCRIPTION OF THE DRAWING

The invention and its mode of operation will be more clearly understood from the following detailed description when read with the appended drawing in which.

DETAILED DESCRIPTION

The term crosstalk was originally coined to indicate the presence in a telephone receiver of unwanted speech sounds from another telephone conversation. Of particular interest in the present invention is crosstalk that is caused by signal coupling between adjacent circuits. The most common coupling is due to near-field effects and can usually be characterized by mutual inductance and direct capacitance. This can best be illustrated by considering two parallel balanced transmission paths. One circuit (the disturbing circuit) is a source of signal energy that is undesirably coupled into an adjacent circuit via stray capacitance and mutual inductance. Near-end crosstalk (NEXT) is crosstalk energy that travels in the opposite direction to that of the signal in the disturbing circuit, whereas far-end crosstalk is crosstalk energy that travels in the same direction as the signal in the disturbing circuit. Circuit analysis indicates that NEXT is frequency dependent and, for connecting hardware, its magnitude typically increases with frequency at a 6.0 dB per octave rate.

Figure 3:
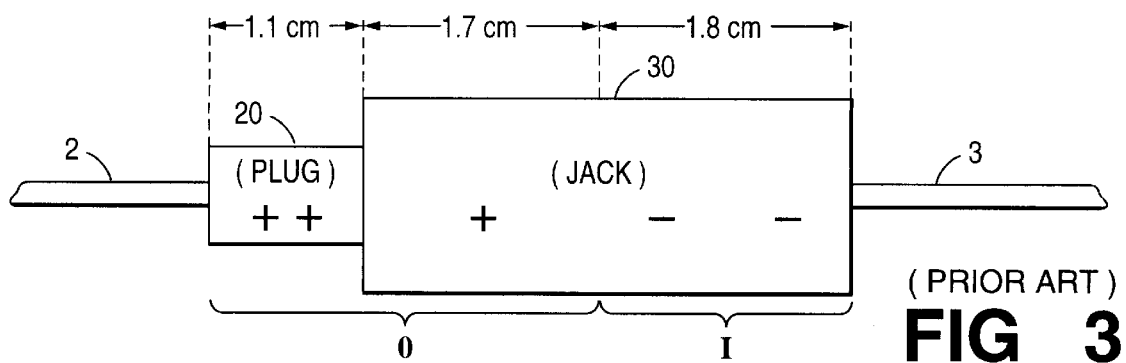
FIG. 3 shows the magnitude and polarity of offending crosstalk and one stage of compensating crosstalk in a prior-art modular plug and jack connector.
Figure 4A:
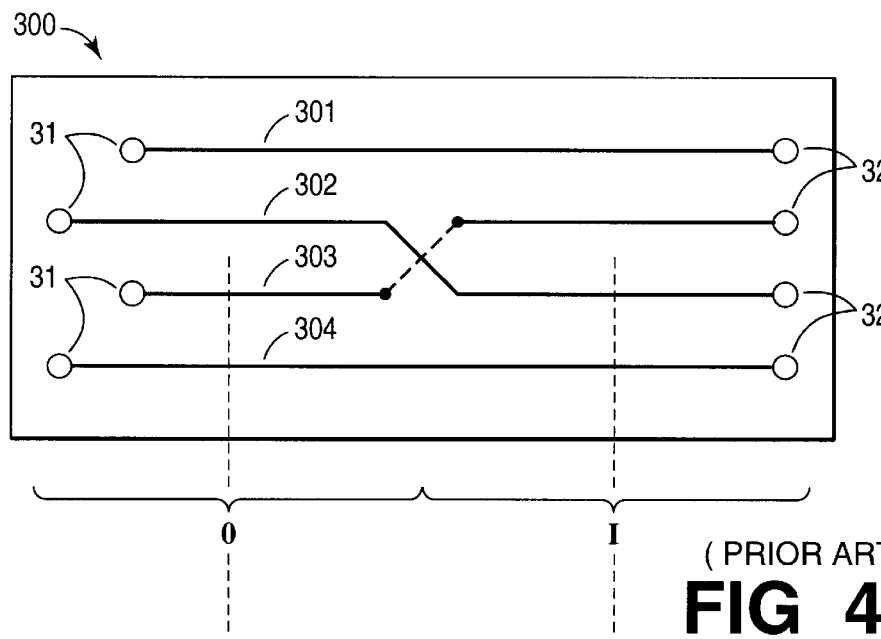
FIG. 4A schematically illustrates a crossover technique that is used to create compensating crosstalk in the prior-art connector of FIG. 3.
Figure 4B:
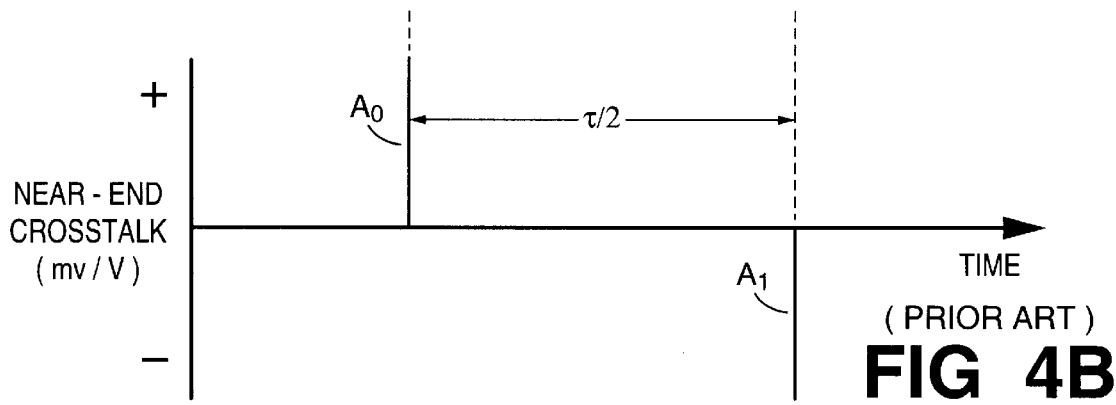
FIG. 4B is a lumped approximation of the magnitude and polarity of crosstalk in the prior-art connector of FIG. 4A, shown as a function of transmission time delay.
Figure 4C:
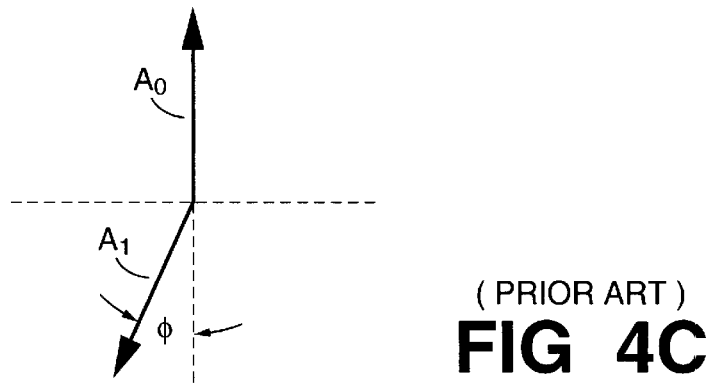
FIG. 4C is a vector diagram of crosstalk in the prior-art connector of FIG. 4A.

FIGS. 4A–4C illustrate the prior-art compensation technique shown in FIG. 3 and disclosed in greater detail in the '647 patent. In particular, FIG. 4A shows that conductors 301–304 extend between input terminals 31 and output terminals 32 of connecting apparatus 300, which comprises metallic conductors supported by a dielectric structure. Conductors 302, 303 form one wire-pair whose electrical signals are coupled to wire pair 301, 304 because of their proximity. The crosstalk between these pairs is graphically shown in FIG. 4B along a time axis to illustrate the ultimate limitation of this prior-art compensation technique. The crosstalk, $A_0$, in Section 0 is a vector quantity that is referred to as the offending crosstalk. It includes crosstalk from modular plug 20 (see FIG. 3) and the input region of jack 30. For the purpose of analysis, the offending crosstalk has a positive polarity. Compensation is achieved by crossing conductor 302 over the path of conductor 303 so that the polarity of the crosstalk between the conductor pairs is reversed. Accordingly, the crosstalk, $A_1$ in Section I is referred to as compensating crosstalk and it has a negative polarity. And although it is recognized that crosstalk is incrementally distributed along the interconnection path that extends between terminals 31 and terminals 32, for the purpose of analysis, $A_0$ and $A_1$ are lumped and effectively occur at the midpoints of Sections 0 and I as shown in FIG. 4B. At this point, it is useful to define two terms that will be used throughout the specification:

Section—a region where signal coupling exists, between conductors or a pair of conductors, along an interconnection path that extends between input and output terminals. In that region, the magnitude and phase of the signal coupling are substantially similar, without abrupt change. Also referred to as a stage.

Effective location—a particular location, usually the center, within a Section where distributed signal coupling is effectively lumped for the purpose of analysis, or where discrete signal coupling exists, between the conductors or the pair of conductors.

Signal energy propagates from input terminals 31 toward output terminals 32, and there is finite time delay $\tau/2$ associated with the time it takes for the signal energy to travel from the midpoint of Section 0 to the midpoint of the Section I. At low frequencies, the compensation scheme of FIG. 4A works extremely well. However, if we assume that electrical signals travel about ⅔ the speed of light within connecting apparatus 200, then at 100 MHz, a phase shift of about 4 degrees occurs over a distance of 2.3 cm, which is a dimension derived from well-known modular plugs and jacks. See, for example, FIG. 3 that includes illustrative dimensions. And since NEXT is crosstalk energy that travels in the opposite direction to that of the signal in the disturbing circuit, then the cancellation effect of compensating crosstalk $A_1$ is delayed by another $\tau/2$ seconds as it travels backwards, thereby making the overall phase shift ($\phi$)about 8 degrees. The effect of this phase shift is demonstrated in FIG. 4C, which is a vector diagram that illustrates why offending crosstalk $A_0$ cannot be completely canceled by compensating crosstalk $A_1$, whose overall phase includes 180 degrees (attributable to conductor crossover) plus a phase shift $\phi$ (attributable to the round trip delay of $\tau$ seconds). Indeed in the present situation, assuming that vectors $A_0$ and $A_1$ have the same magnitude, then the offending crosstalk $A_0$ can, at best, be improved by 17 dB at 100 MHz for a connector having the dimensions shown in FIG. 3.

Figure 5A:
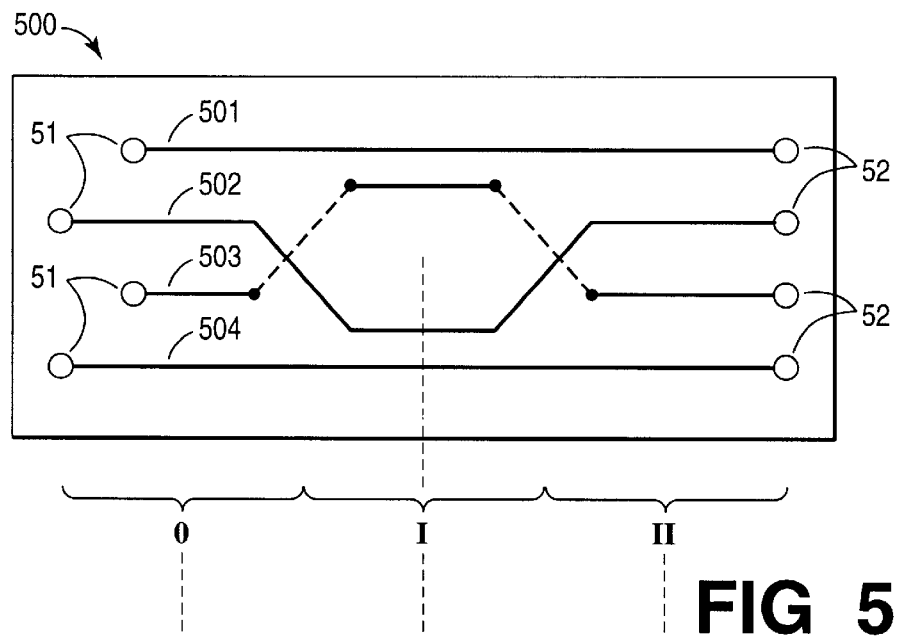
FIG. 5A schematically illustrates an improved technique for creating compensating crosstalk in an electrical connector, according to the invention.
Figure 5B:
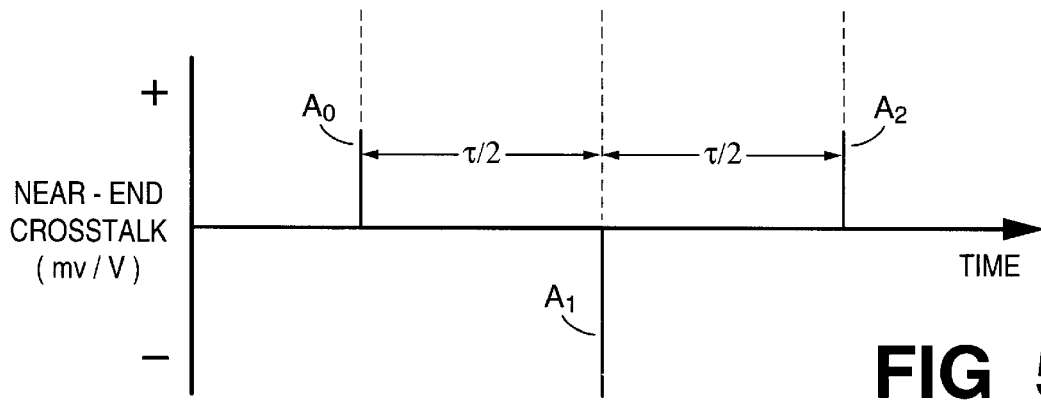
FIG. 5B shows a lumped approximation of the magnitude and polarity of crosstalk in the electrical connector of FIG. 5A, shown as a function of transmission time delay.
Figure 5C:
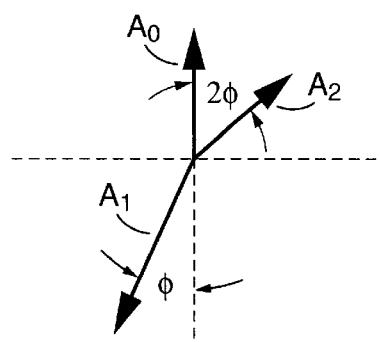
FIG. 5C is a vector diagram of crosstalk in the electrical connector of FIG. 5A.
Figure 12:
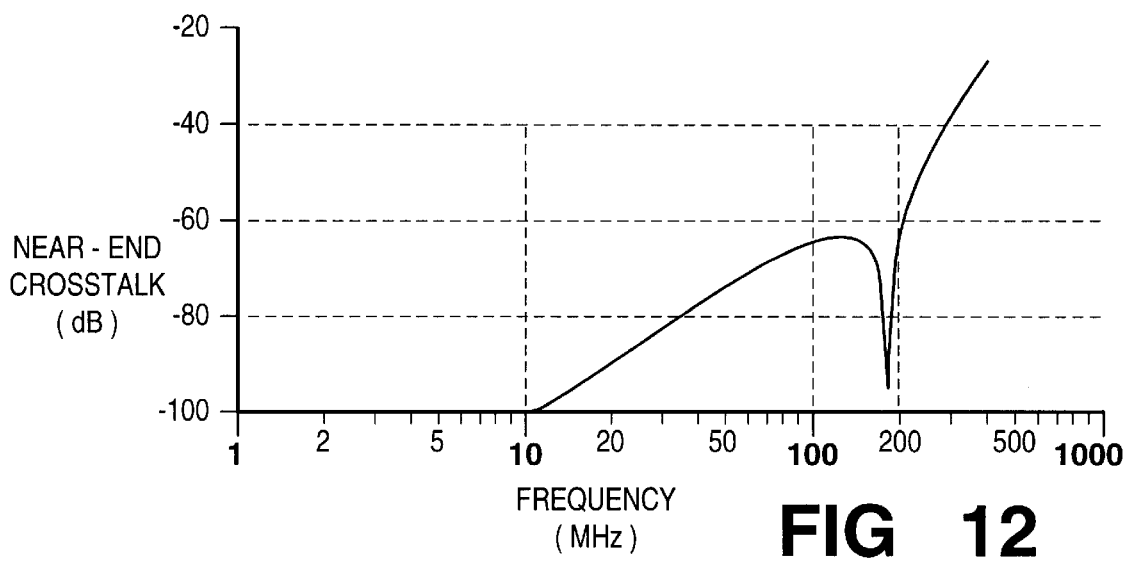
FIG. 12 is a graph showing calculated near-end crosstalk as a function of frequency for an electrical connector using three-stage compensation.
Figure 13:
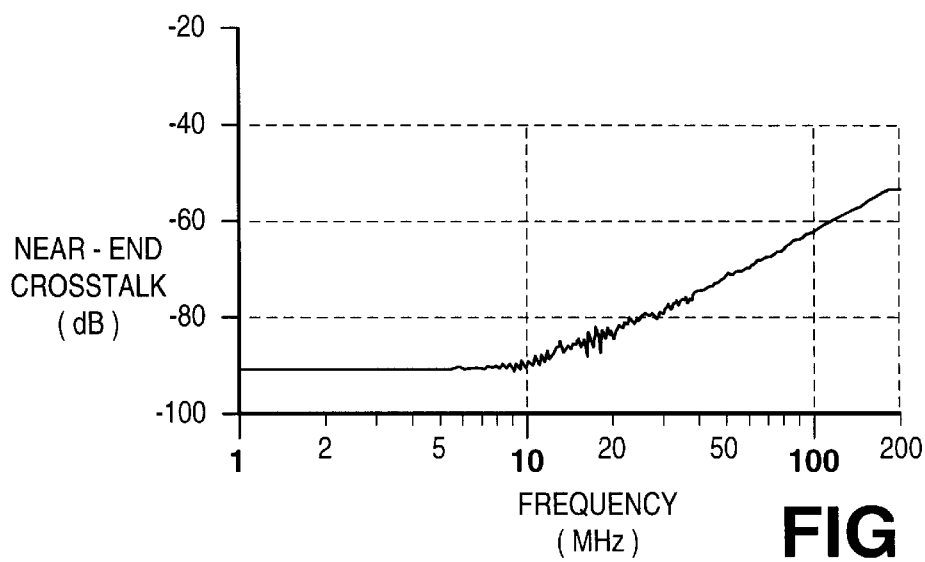
FIG. 13 is a graph showing measured near-end crosstalk as a function of frequency for the electrical connector of FIG. 6.

FIG. 5A schematically illustrates an improved technique for creating compensating crosstalk in an electrical connector according to the invention. In particular, FIG. 5A shows that conductors 501–504 extend between input terminals 51 and output terminals 52 of connecting apparatus 500. Conductors 501, 504 form one wire pair that straddles wire-pair 502, 503. Such straddling increases the amount of signal coupling between the wire pairs and represents a worst case situation. It is noted that the present invention is equally applicable to the situation wherein conductors 501, 502 form one wire pair that is near wire-pair 503, 504. In either situation, the crosstalk between the two pairs is graphically shown in FIG. 5B along a time axis. The crosstalk $A_0$, in Section 0 is a vector quantity that is referred to as the offending crosstalk. It includes crosstalk from modular plug 20 (see FIG. 3) and the input region of jack 30. For the purpose of analysis, the offending crosstalk has a positive polarity. Compensation is achieved by crossing conductor 502 over the path of conductor 503 so that the polarity of the crosstalk between the conductor pairs is reversed. Accordingly, the crosstalk, $A_1$, in Section I is referred to as compensating crosstalk and it has a negative polarity. (Note that the magnitude of $A_1$ is approximately twice the magnitude of the offending crosstalk $A_0$.) The present invention includes at least one more component of compensating crosstalk, which is designated $A_2$ and illustratively shown in FIG. 5B having the same approximate magnitude as the offending crosstalk $A_0$. By carefully choosing the crossover locations and the amount of coupling between wire-pair 501, 504 and wire-pair 502, 503 (see FIG. 5A), the magnitude and phase of vectors $A_0$, $A_1$, $A_2$ can be selected to nearly cancel each other. For example, if the length of Section I is increased, then the magnitude and phase of vector $A_1$ is increased; and if conductors 501, 503 or 502, 504 are moved closer together in Section I, then the magnitude of vector $A_1$ is increased. Finally it is noted that because the phase shift $\phi$ is a function of frequency, the present technique may be used to create a null at one or more given frequencies in the range 50–400 MHz, but not at all frequencies. Reference is briefly made to FIG. 12 which is a graph of a calculated NEXT as a function of frequency for a connector having three (3) Sections of compensating crosstalk. Note that a null is positioned at about 180 MHz to reduce NEXT in the frequency range 100–200 MHz. However, FIG. 13 shows a graph of measured NEXT as a function of frequency for the embodiment of FIG. 6. Here, NEXT is more than 49 dB below the level of the incoming signal at all frequencies below 200 MHz; and more than 55 dB below the level of the incoming signal at all frequencies below 100 MHz. And as more Sections of compensating crosstalk are added, then more complete vector cancellation is approached (i.e., cancellation occurs over a broader span of frequencies).

And while the present invention illustratively shows the introduction of compensating crosstalk in a communication jack, it is noted that compensating crosstalk may also be provided by a plug, which inserts into the communication jack. One such plug is shown in application Ser. No. 08/922,580, which was filed on Sep. 3, 1997 and is hereby incorporated by reference. This cross-reference is not essential for the current application. It is clear that plugs and jacks are intended to operate together, and that it is their combined crosstalk that is reduced approximately to zero by the present invention.

Figure 6:
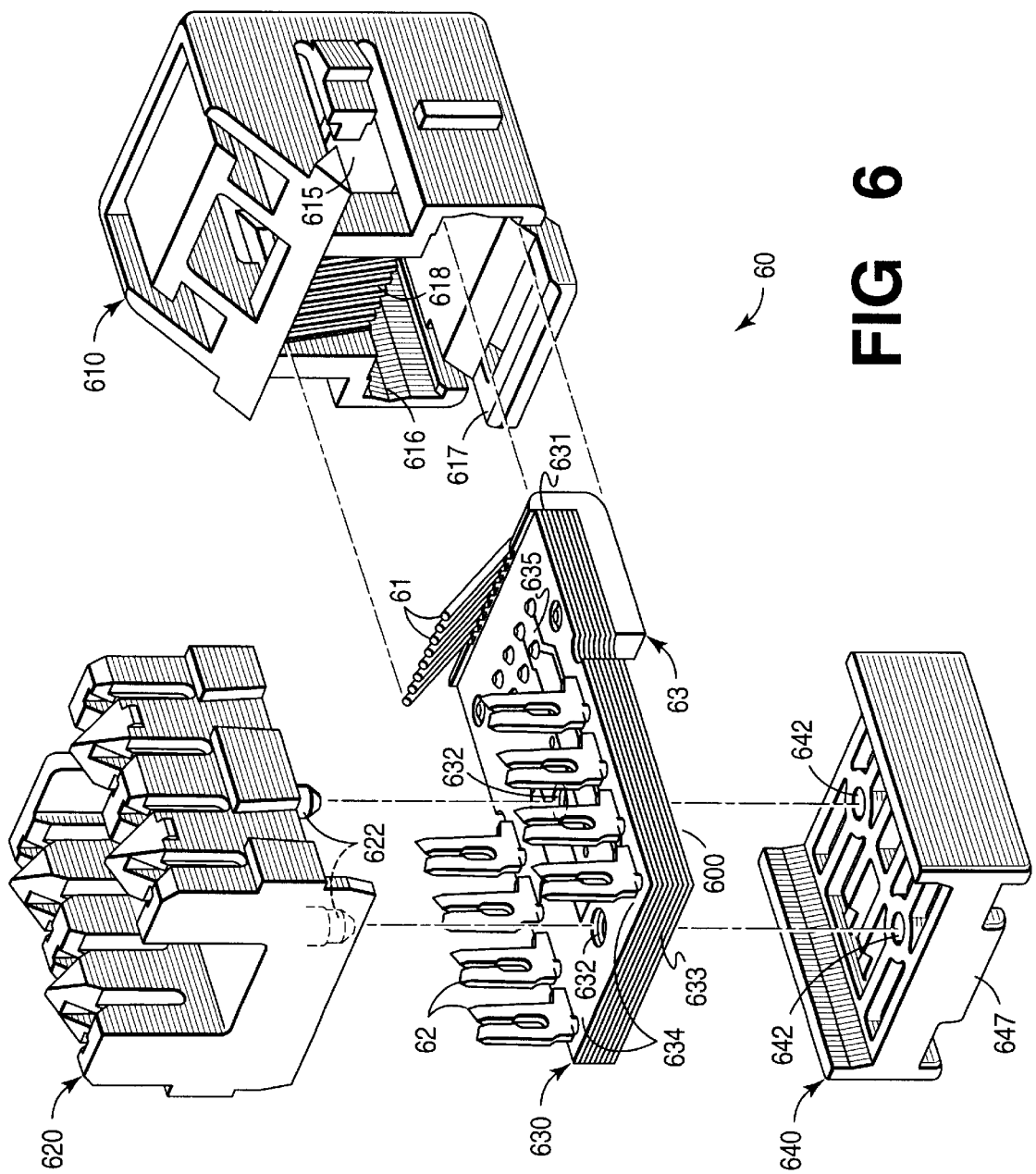
FIG. 6 is an exploded perspective view of a first embodiment of an electrical connector having time-delayed crosstalk compensation according to the invention.

FIG. 6 is an exploded perspective view of a first embodiment of an electrical connector having time-delayed crosstalk compensation according to the invention. The connector 60 comprises a printed wiring board assembly 630, which is enclosed within dielectric components 610, 620, 640. In particular, the assembly 630 includes a multi-layered printed wiring board 600 having conductive paths that extend between a jackwire terminal region 635 near a forward edge 631 of the board, and a wire-connection terminal region 634 near a rear edge 633 of the board.

Figure 1:
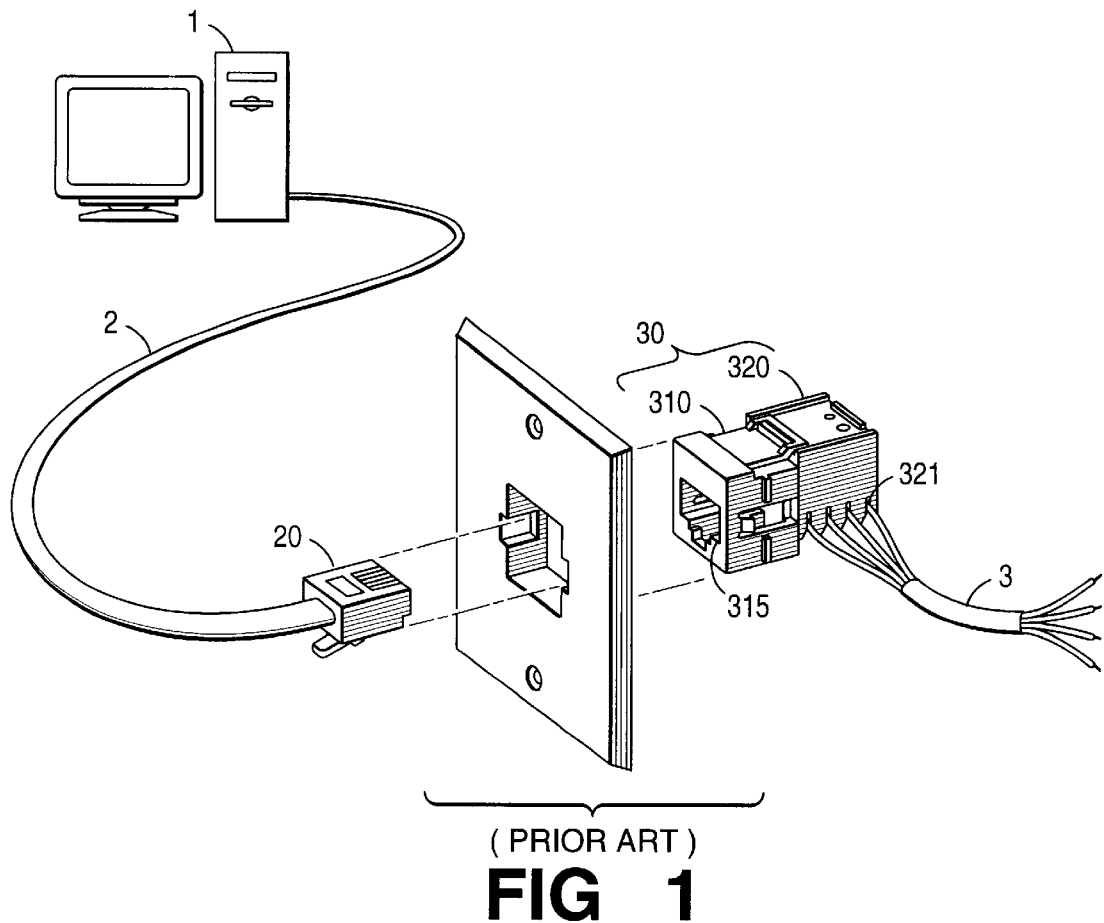
FIG. 1 discloses the use of modular connectors to interconnect high speed station hardware with a communication cable.

A number (e.g., eight) of spring jackwires 61 extend from the jackwire terminal region 635 at an acute angle relative to the top surface of the wiring board 600. The jackwires 61 connect at their bottom ends to corresponding conductive paths in the wiring board. The conductive paths are dimensioned and arranged on the board layers in such a manner that crosstalk is substantially reduced over an entire connection comprising electrical connector 60 and an associated plug (e.g., a modular plug 20 such as shown in FIG. 1). The board may also contain discrete components such as resistors, capacitors and inductors for crosstalk reduction between pairs of conductive paths. The bottom ends of the jackwires 61 are inserted in metal-plated openings in the bottom surface of the wiring board to connect with the conductive paths, and the jackwires wrap around a curvilinear forward end of a jackwire block 63. Preferably, the bottom ends of the jackwires 61 have a "needle eye" construction that allows the ends to be pushed into the metal-plated openings underneath the board 600. These openings have a diameter that is slightly less than that of the bottom ends of the jackwires. A reliable electrical connection is therefore established between the jackwires and the conductive paths without a need for soldering.

Insulation-displacement connector (IDC) terminals 62 are mounted at both rear sides of the wiring board 600 as shown in FIG. 6. Each of the terminals 62 connects to a corresponding conductive path associated with a different one of the spring jackwires 61. A pair of terminal housing mounting holes 632 are formed in the wiring board 600 along a center line between the rear sides of the board.

A jack frame 610 for the electrical connector 60 may be similar to one disclosed in co-pending U.S. patent application Ser. No. 08/866,796 (U.S. Pat. No. 5,897,395) filed May 30, 1997, and assigned to the assignee of the present invention. This cross-reference is not essential for the current application. All relevant portions of the Application are incorporated by reference herein. Alternatively, a jack frame similar to the one disclosed in the above-mentioned U.S. Pat. No. 5,096,442 may also be used for the jack frame 610. The frame 610 has an opening or cavity 615 that is dimensioned to receive a modular plug in its front end, and a rear opening or cavity 616 that is dimensioned to receive the forward edge 631 of the wiring board 600 including jackwires 61. The rear opening of the jack frame is formed with a number (e.g., eight) of vertical slots 618, which receive corresponding ones of the jackwires 61 and guide each jackwire to deflect when a plug (not shown) is inserted through the front opening 615 of the jack frame. Wire conductors carried by the inserted plug thus establish electrical contact with corresponding ones of the jackwires 61.

An electrically insulative or dielectric terminal housing 620, also shown in FIG. 6, is formed to protect and to permit wire lead access to the wire-connection terminal region 634 on top of wiring board 600. The housing 620 may also be formed of a plastics material that meets all applicable standards with respect to electrical insulation an flammability. Such plastics materials include, but are not limited to, Polyvinyl Chloride (PVC), Acrylonitrile Butadiene Styrene (ABS), or polycarbonate. The housing 620 has a pair of mounting posts 622 that project from a bottom surface of the housing. When the housing 620 is aligned with the IDC terminals 62 on the wiring board 600 and lowered to surround the terminals, the mounting posts 622 align with the mounting holes 632 in the board 600 and pass through them to project from below the board.

A cover 640 is made from a material that may be the same or similar to that of the housing 620 and the jack frame 610. Cover 640 is formed to protect the bottom of the board 600 at the wire-connection terminal region 634. The cover includes a pair of openings 642 formed along a center line between sides of the cover 640, to align with tips of the housing mounting posts 622 that project below the wiring board 600. The wiring board 600 is "sandwiched" or captured between the housing 620 and the cover 640, and the tips of the mounting posts 622 are preferably joined to the body of the cover by, for example, an ultrasonic welding probe inserted into the cover openings 642 from below the cover. The tips of the mounting posts 622 and surrounding cover body melt and fuse with one another to form solid joints when cooled. With the wiring board 600 thus captured between the housing 620 and the cover 640, substantially the entire wire-connection terminal region 634 of the board is protectively enclosed.

The jack frame 610 has a latch 617 protruding below its rear opening 616. The cover 640 has a pair of shoulders 647 adjacent the front and back edges of the cover. Once the housing 620 is joined to the cover 640 with the wiring board 600 captured between them, the front edge 631 of the wiring board is inserted into the rear opening 616 in the jack frame 610 until the latch 617 snaps over and onto the adjacent shoulder on the bottom of cover 640.

Figure 7A:
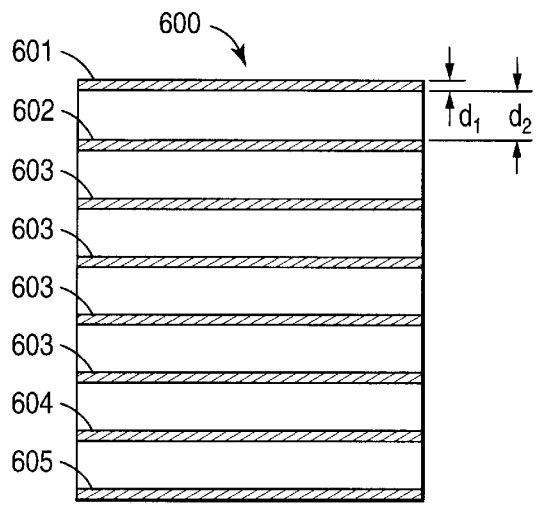
FIG. 7A shows an end view of a printed wiring board having multiple layers for introducing compensating crosstalk according to the invention.
Figure 7B:
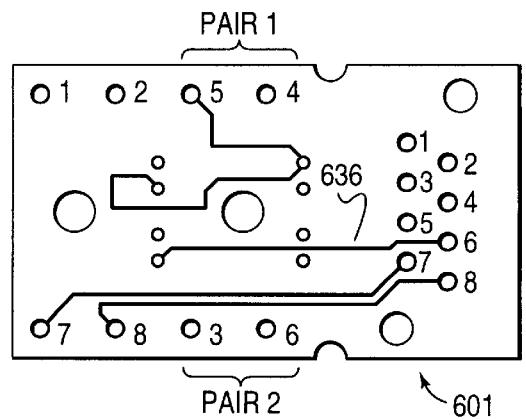
FIG. 7B–7F show wiring layouts on the various layers of the printed wiring board shown in FIG. 7A.
Figure 7C:
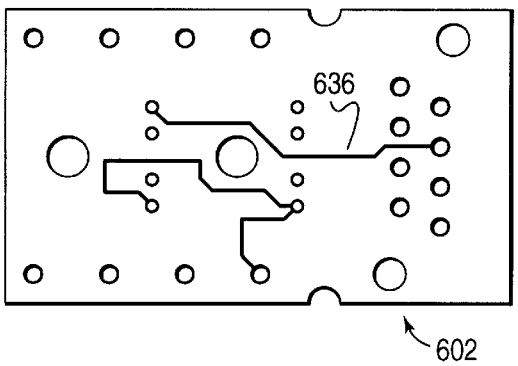

The actual construction of wiring board 600 is disclosed in FIGS. 7A–7F. An end view of printed wiring board 600 is shown in FIG. 7A having eight layers of wiring paths for introducing compensating crosstalk according to the invention. Each of the layers comprises one or more metallic paths of thickness $d_1$ positioned on a dielectric material of thickness $d_2$. Illustratively, $d_1$=0.04 millimeters (mm) and $d_2$=0.30 mm. An exemplary construction is disclosed in U.S. patent application Ser. No. 08/668,553, which was filed on Jun. 21, 1996 by Choudhury et al. and assigned to the present assignee. The relevant portions of that Application are hereby incorporated by reference. Briefly, four double-sided printed wiring boards are joined into a single unit 600 by epoxy layers in a manner known in the art. Each printed wiring board comprises a board material, such as FR-4, with conductive paths patterned on its top and bottom surfaces by standard techniques such as photolithography. And while eight layers of conductor paths are shown in this illustrative embodiment, it will be appreciated that any number can be employed.

Figure 2:
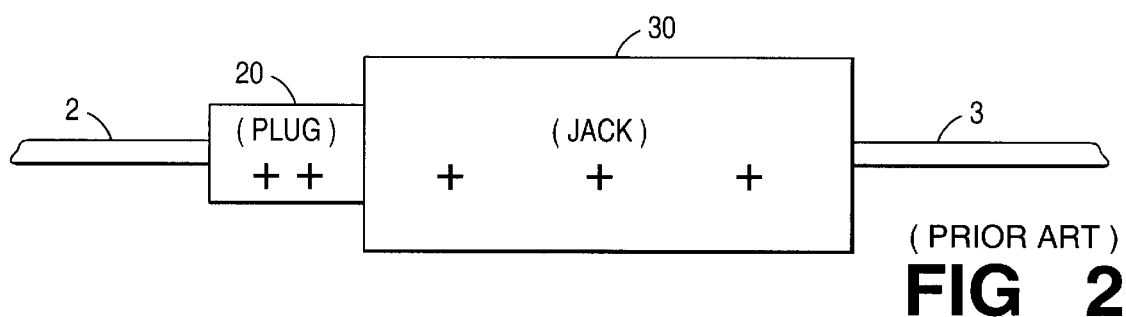
FIG. 2 shows the magnitude and polarity of offending crosstalk in a prior-art modular plug and jack connector.
Figure 7D:
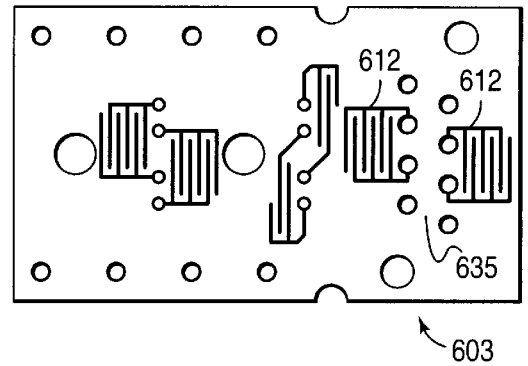
Figure 7E:
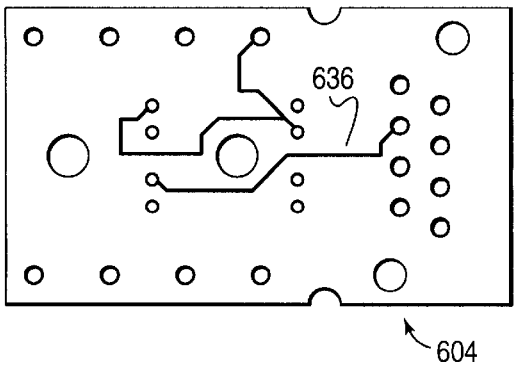
Figure 7F:
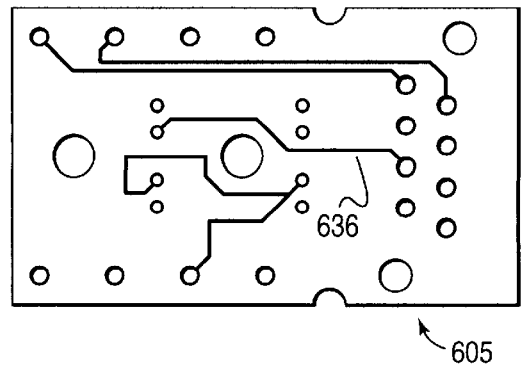
Figure 8:
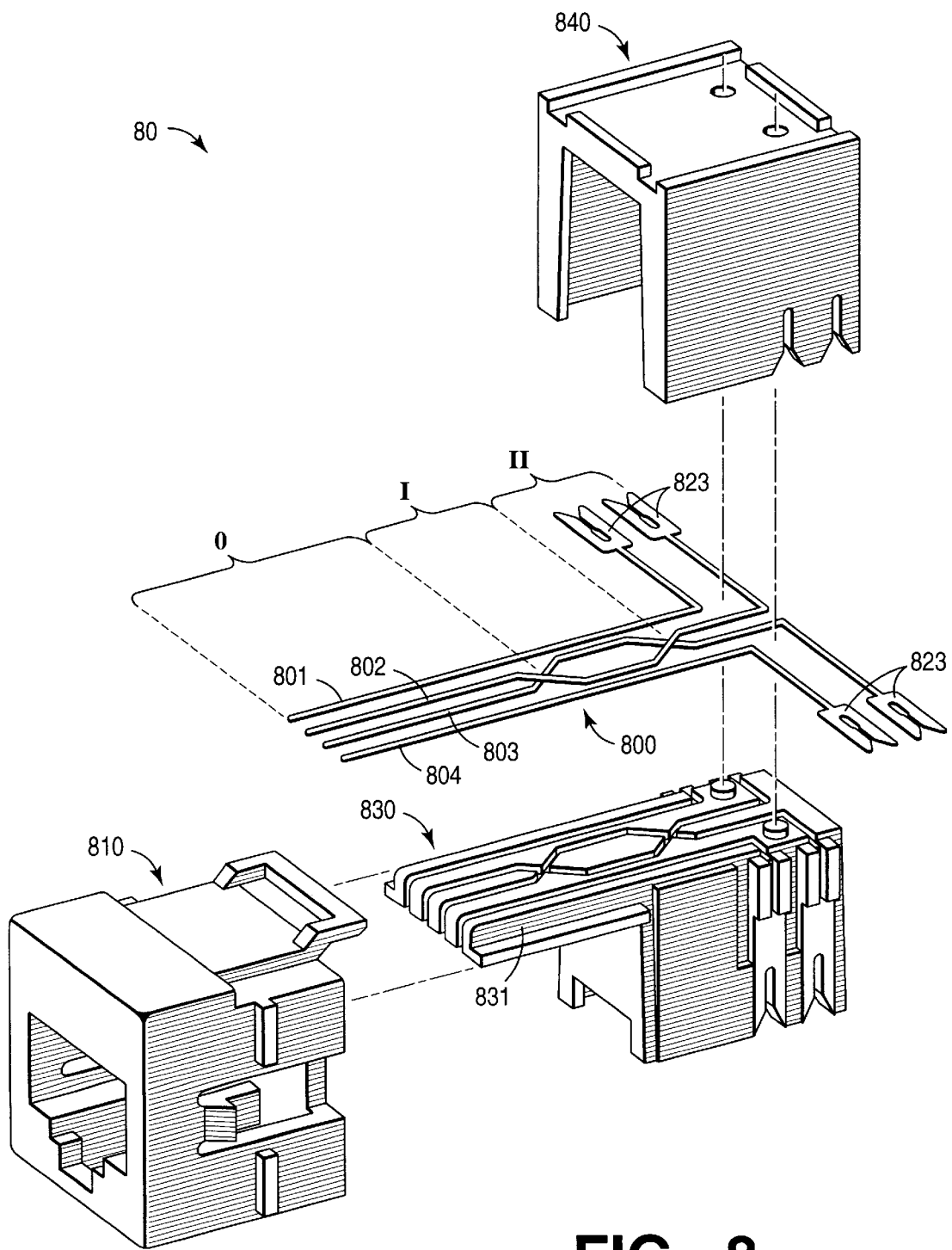
FIG. 8 is an exploded perspective view of a second embodiment of a high frequency electrical connector having time-delayed crosstalk compensation according to the invention.
Figure 9:
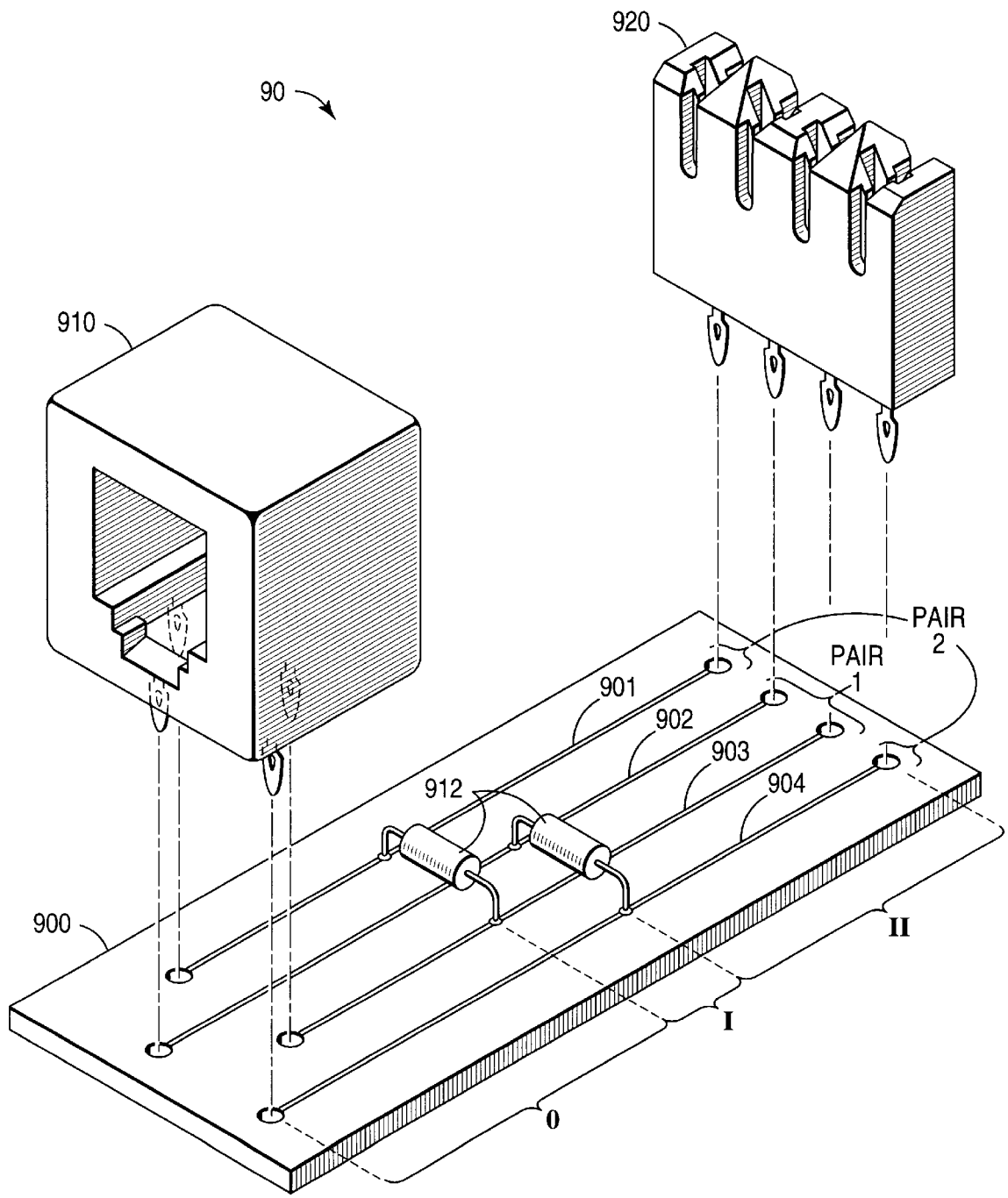
FIG. 9 is an exploded perspective view of a third embodiment of a high frequency electrical connector having time-delayed crosstalk compensation according to the invention.
Figure 10:
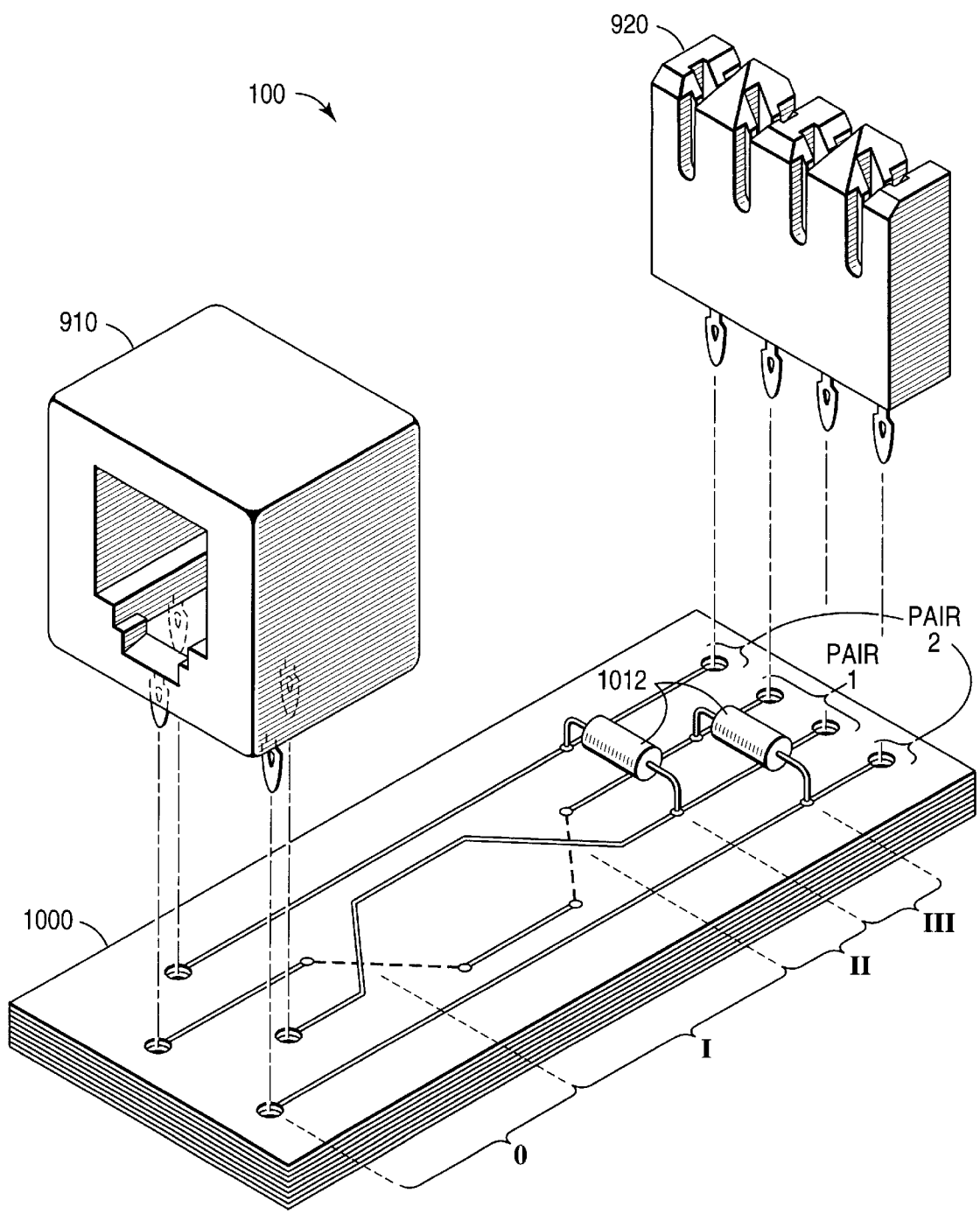
FIG. 10 is an exploded perspective view of a fourth embodiment of a high frequency electrical connector having time-delayed crosstalk compensation according to the invention.

FIGS. 7B–7F show top views of the wiring layouts on each of the layers of the printed wiring board 600. Note that the same wiring layout 603, shown in FIG. 7D, is used on four (4) layers of the wiring board. In this particular embodiment of the invention, the wiring layout of FIGS. 7B–7F provides three stages of compensating crosstalk between wire-pair 1 (pins 4, 5) and wire-pair 2 (pins 3, 6), which are identified in FIG. 7B. (It is noted that the industry generally refers to pins 3, 6 as wire-pair 3; e.g., see FIG. 2 of the '647 patent) Reference is briefly made to FIG. 7D, which shows discrete capacitors 612 connected between wire-pair 1 and wire-pair 2 at the closest possible point to where signals enter layer 603 in the jackwire terminal region 635 of board 600, and they comprise the first stage of compensating crosstalk. And while these discrete capacitors 612 comprise closely spaced wiring patterns on a printed wiring board, stand-alone discrete component structures are shown in FIGS. 9 and 10. Additionally, although not immediately apparent from the wiring paths shown in FIGS. 7B, 7C, 7E and 7F, there is inductive coupling between wire-pairs 1, 2 in region 636 in the form of closely spaced inductive loops that face each other. The self inductance of these loops improves the return-loss performance of the connector, while the inductive coupling between these loops is part of the compensating crosstalk FIG. 8 is an exploded perspective view of a second embodiment of an electrical connector having time-delayed crosstalk compensation according to the invention. Electrical connector 80 comprises spring block 830, conductor array 800, cover 840 and jack frame 810. Conductor array 800 is made from two lead frames, one of which includes conductors 801, 803, and the other includes conductors 802, 804 which are identical to each other. These lead frames are reversed, left-to-right, with respect to each other and overlaid on each other in the manner disclosed in U.S. Pat. No. 5,186,647. These lead frames are positioned on the top surface of spring block 830 which includes grooves having the same pattern as the overlaid lead frames. Heat is then selectively applied to the grooves via ultrasonic welding in order to deform the thermoplastic material from which the spring block is made to permanently join the lead frames and spring block together. IDC terminals 823 are folded down the sides of the spring block while the conductors in Section 0 of conductor array 800 are wrapped around tongue-like projection 831 of the spring block 830. Thereafter, cover 840 is joined to the spring block to create a unitary structure. In this embodiment, spring block 830, cover 840 and jack frame 810 are all made from a thermoplastic material such as PVC. Significantly, conductor leads 802 and 803 cross over each other in two locations in order to provide two Sections (I and II) where compensating crosstalk is introduced in order to cancel the offending crosstalk in Section 0. Reference is made to FIG. 5A where the same crossover technology is employed on a printed wiring board to provide two stages of compensating crosstalk.

However, crossover technology is not required in the practice of the present invention as evidenced by the embodiment of FIG. 9 where discrete components 912 are used to provide compensating crosstalk in Section I. FIG. 9 illustrates a connecting apparatus 90 that embodies the present invention in a convenient design. In this embodiment, wire-pair 1 comprising conductors 902, 903 is straddled by wire-pair 2 comprising conductors 901, 904. These conductors all extend along a top surface of printed wiring board 900 without crossing over each other. In Section 0, offending crosstalk comes from closely spaced wires within a modular plug (not shown), modular jack 910, and conductors 901–904 on board 900. Discrete components 912, are used to couple electrical signals between wire-pairs 1 and 2 thereby introducing compensating crosstalk between the wire pairs. And while only two components 912 are shown, it is understood that they represent a combination of resistors and/or capacitors and/or inductors that are selected to provide compensating crosstalk, having a predetermined magnitude and phase at a given frequency, between wire-pairs 1 and 2 in Section I. As shown in FIG. 9, a second stage (Section II) of compensating crosstalk is provided, and it includes the crosstalk coming from conductors 901–904 as well as the crosstalk coming from terminal block 920, which is used for making wire connections and preferably includes four IDC terminals. FIG. 9 only shows a single jack frame 910 and terminal block 920, but it is understood that it is common practice to install many jack frames and terminal blocks on a single board. Moreover, it is common practice to have more than four conductive paths between the jack frame and terminal block and such structures are contemplated by the present invention.

FIG. 10 is a variation on the embodiment of FIG. 9 in which crossover technology is combined with discrete component technology to introduce multiple stages of compensating crosstalk according to the present invention. In Section 0, offending crosstalk comes from closely spaced wires within a modular plug (not shown), modular jack 910, and conductors on board 1000. This offending crosstalk is substantially canceled in magnitude and phase at a given frequency by compensating crosstalk from Sections I–III. In Section I, crossover technology is illustratively used to introduce compensating crosstalk that is almost 180 degrees out of phase with the offending crosstalk. In Section II, crossover technology is used again to introduce compensating crosstalk that is almost 180 degrees out of phase with the crosstalk introduced in Section I. And in Section III, additional compensating crosstalk is introduced via discrete components 1012 whose magnitude and phase at a given frequency are selected to substantially eliminate all NEXT in connecting apparatus 100.

Figure 11:
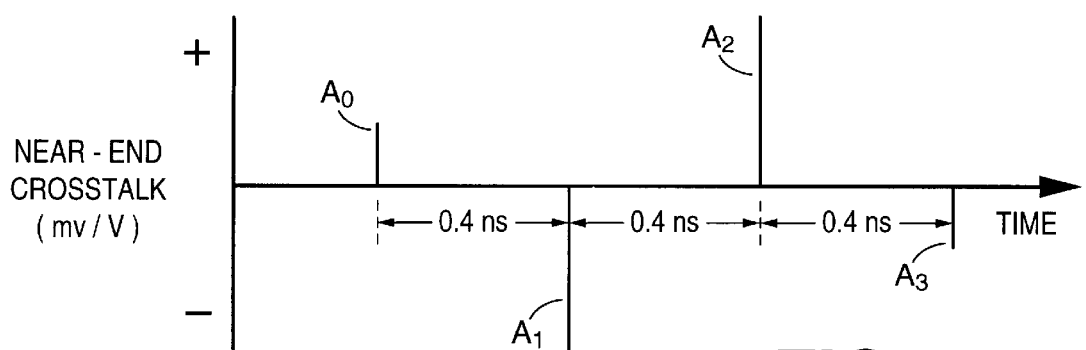
FIG. 11 shows the magnitude and polarity of crosstalk as a function of transmission time delay in a three-stage compensation scheme according to the invention.

FIG. 11 is a vector diagram of crosstalk in a three-stage compensation scheme, according to the invention, for the electrical connector of FIG. 6. In particular, offending crosstalk vector $A_0$ is substantially canceled by compensating crosstalk vectors $A_1$, $A_2$, $A_3$ whose magnitudes and polarities are generally indicated in FIG. 11. It is noted that the offending crosstalk $A_0$ is primarily attributable to the closely spaced parallel wires within the conventional modular plug 20 (see FIG. 1), which is inserted into the electrical connector 60 (see FIG. 6) of the present invention. The magnitudes of the vectors $A_0$–$A_3$ are in millivolts (mv) of crosstalk per volt of input signal power. The effective separation between stages is designed to be about 0.4 nanoseconds. The following vector magnitudes apply to FIG. 11:

$A_0$=17.0 mv/volt $A_1$=47.6 mv/volt $A_2$=47.6 mv/volt $A_3$=17.0 mv/volt

This particular selection of vector magnitudes and phases provides a null at about 180 MHz in order to reduce NEXT to a level that is 60 dB below the level of the input signal for all frequencies below 100 MHz. Obviously, vectors can be selected to produce one or more nulls at other frequencies in order to meet particular design objectives.

FIG. 12 is a graph showing calculated NEXT as a function of frequency using the vector magnitudes discussed in connection with FIG. 11. The present invention represents the first recognition that delayed compensation stages can reduce NEXT to negligible values in practical electrical connectors.

Although various particular embodiments of the present invention have been shown and described, modifications are possible within the spirit and scope of the invention. These modifications include, but are not limited to, the introduction of compensating signals within the plug itself and the use of time-delayed signal compensation in electrical connecting apparatus other than modular plugs and jacks. It is also understood that it is possible to introduce time delay using discrete elements (e.g. inductors and capacitors) rather than, or in addition to, physical separation along the interconnection path, and that time-delayed signal compensation can be used between individual conductors as well as pairs of conductors. It is finally understood that time-delayed signal compensation can be used to improve return loss and balance and as well as crosstalk.

We claim:

1. An electrical connector for providing predetermined amounts of compensating signals to approximately cancel a like amount of an offending signal at a given frequency, the connector including first and second pairs of metallic conductors that are adjacent to each other and form an interconnection path between input and output terminals, the connector further including a first compensation stage that is positioned at a first effective location along the interconnection path, wherein compensating signals having a first magnitude and polarity are coupled between the pairs;

a second compensation stage that is positioned at a second effective location along the interconnection path, wherein a compensating signal having a second magnitude and polarity is coupled between the pairs, wherein the first and second polarities are opposite to each other; and said first and second effective locations being time delayed with respect to each other in order to provide predetermined phase shifts, at the given frequency, between the offending signal and each of the compensating signals.

2. The connector of claim 1 wherein the connector comprises a plug and a jack.

3. The connector of claim 1 wherein the offending signal comprises a reflected signal on the conductors due to impedance mismatch.

4. The connector of claim 1 wherein the offending signal comprises a differential-mode signal on the conductors caused by impedance imbalance.

5. The connector of claim 1 wherein the compensating signal provided by one of the compensation stages is effected by a change in the position of the electrical conductors, relative to each other, in such a manner that the polarity of signal coupling between the pairs of conductors is reversed.

6. The connector of claim 1 wherein the compensating signal provided by one of the compensation stages is effected by the interconnection of discrete capacitors between the conductors.

7. The connector of claim 6 wherein the discrete capacitors comprise conductive patterns on a printed wiring board.

8. The connector of claim 1 wherein the metallic conductors that form the interconnection path between the input and output terminals comprise a lead frame affixed to a plastic block.

9. The connector of claim 1 wherein the magnitude of the compensating signal provided by the first compensation stage significantly overcompensates the offending signal that is present between the conductors at the input terminals of the electrical connector.

10. The connector of claim 9 wherein the magnitude of the compensating signal provided by the first compensation stage is about twice the magnitude of the offending signal.

11. The connector of claim 1 wherein the metallic conductors that form an interconnection path between input and output terminals comprise wiring paths on a printed wiring board.

12. The connector of claim 11 wherein the printed wiring board includes at least two layers of wiring paths.

13. The connector of claim 1 wherein the offending signal comprises near-end crosstalk between said conductors.

14. The connector of claim 13 wherein the overall near-end crosstalk for the connector is more than 49 dB below the level of an incoming signal at 200 MHz.

15. The connector of claim 13 wherein the overall near-end crosstalk for the connector is more than 55 dB below the level of an incoming signal at 100 MHz.

16. A communication jack assembly comprising:
   a wire board having conductive paths that extend between a jackwire terminal region on a first portion of the board and a wire-connection terminal region on a second portion of the board;
   a plurality of spring jackwires extending from the jackwire terminal region of the board, one end of the jackwires being connected to corresponding ones of the conductive paths;
   a dielectric terminal housing formed to protect the wire-connection terminal region on the top surface of the wire board; and
   a dielectric cover formed to protect the wire-connection terminal region at the bottom surface of the wire board;
   wherein said conductive paths include at least two effective locations where signal energy is coupled between the pairs of conductors to provide compensating crosstalk for canceling a known amount of offending crosstalk, which is present in the jackwire terminal region when electrical signals are present, said compensating crosstalk signals being time delayed with respect to each other and having predetermined magnitudes and phases that combine to approximately cancel the offending crosstalk at a given frequency.

17. The communication jack assembly of claim 16 further comprising:
   a plurality of insulation-displacement connector (IDC) terminals mounted on the top surface of the wire board in the wire-connection terminal region, the IDC terminals being electrically connected to corresponding conductive paths on the wire board.

18. An electrical connector having at least two pairs of conductors that extend alone a metallic interconnection path between input and output terminals, said connector including at least three effective locations along the interconnection path where signal energy is coupled between the pairs of conductors, at one or more given frequencies the signal energy at each effective location has a predetermined magnitude and phase relative to the other effective locations such that near-end crosstalk is approximately canceled, wherein said one or more given frequencies is in the range 50–400 MHz.

19. The connector of claim 18 wherein the connector comprises a printed wiring board.

20. The connector of claim 19 wherein the printed wiring board comprises a plurality of horizontally disposed dielectric layers, each layer having one or more metallic paths thereon, each layer being electrically connected to another layer by vertically disposed metallic paths that extend through the dielectric layers.

21. A low-crosstalk electrical connector system comprising a jack mounted on a printed wiring board at an input-terminal region of the board, offending crosstalk being present at the input-terminal region when electrical signals are present, said offending crosstalk comprising unwanted signal coupling between pairs of conductors at the input-terminal region having a known magnitude and phase at a given frequency;
   the printed wiring board including two pairs of metallic conductors that extend away from the jack along a signal-conducting path, which includes first and second stages where compensating crosstalk is coupled between the pairs of conductors for the purpose of canceling the offending crosstalk;
   the first stage providing compensating crosstalk between the pairs of conductors having a first magnitude and phase;
   the second stage providing compensating crosstalk between the pairs of conductors having a second magnitude and phase, wherein a vector sum of the offending and compensating crosstalk signals approximately cancel each other at the given frequency.

22. The electrical connector system of claim 21 wherein the first stage comprises closely spaced electrical conductors that extend between a first crossover point and a second crossover point, said crossover points being locations where the relative position of at least two of the electrical conductors is changed in such a manner that the polarity of signal coupling between the pairs of conductors is reversed.

23. The electrical connector system of claim 21 wherein the signal-conducting path extends between the input-terminal region where the jack is mounted and an output-terminal region where a wire connector is mounted.

24. The electrical connector system of claim 23 wherein the wire connector comprises a plurality of insulation-displacement connectors.

25. The electrical connector system of claim 23 wherein the first stage comprises a plurality of discrete electrical components that interconnect the pairs of conductors.

26. The electrical connector system of claim 25 wherein the discrete electrical components include capacitors.

27. A method for reducing a known amount of offending crosstalk at a given frequency, said crosstalk existing between first and second pairs of conductors at an input-terminal region of an electrical connector, the first pair being adjacent to the second pair, the method comprising the steps of:

coupling a first amount of compensating crosstalk from the first pair of conductors onto the second pair of conductors, said first amount having a predetermined first magnitude and polarity at the given frequency;

coupling a second amount of compensating crosstalk from the first pair of conductors onto the second pair of conductors, the second amount having a second predetermined magnitude and polarity at the given frequency, said first and second polarities being opposite to each other; and providing a predetermined time delay between the steps of coupling the first and second amounts of compensating crosstalk from the first pair of conductors onto the second pair of conductors.

\* \* \* \* \*